(12) United States Patent
Huang

(10) Patent No.: US 11,644,723 B2
(45) Date of Patent: May 9, 2023

(54) ELECTROSTATIC DISCHARGE (ESD) PROTECTION STRUCTURE AND DISPLAY PANEL

(71) Applicant: HKC CORPORATION LIMITED, Shenzhen (CN)

(72) Inventor: Xiaoyu Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 166 days.

(21) Appl. No.: 17/272,344

(22) PCT Filed: Jan. 18, 2019

(86) PCT No.: PCT/CN2019/072253
§ 371 (c)(1),
(2) Date: Feb. 28, 2021

(87) PCT Pub. No.: WO2020/093597
PCT Pub. Date: May 14, 2020

(65) Prior Publication Data
US 2021/0318581 A1      Oct. 14, 2021

(30) Foreign Application Priority Data
Nov. 9, 2018   (CN) .......................... 201811332323.5

(51) Int. Cl.
*G09G 3/36* (2006.01)
*H01L 27/02* (2006.01)
(Continued)

(52) U.S. Cl.
CPC ..... *G02F 1/136204* (2013.01); *G09G 3/3614* (2013.01); *G09G 3/3648* (2013.01);
(Continued)

(58) Field of Classification Search
CPC .............. G09G 3/3648; H01L 27/0255; G02F 1/136204
See application file for complete search history.

(56) References Cited

U.S. PATENT DOCUMENTS

2008/0266475 A1 * 10/2008 Chang .................. G09G 3/3648
349/40
2010/0123869 A1    5/2010 Itakura et al.
(Continued)

FOREIGN PATENT DOCUMENTS

| CN | 1389846 A | 1/2003 |
|---|---|---|
| CN | 1811534 A | 8/2006 |

(Continued)

OTHER PUBLICATIONS

Jie Zhong, the International Searching Authority written comments, dated Jul. 2019, CN.
(Continued)

*Primary Examiner* — William Boddie
*Assistant Examiner* — Andrew B Schnirel

(57) ABSTRACT

This application relates to an electrostatic discharge (ESD) protection structure of a display panel, and a display apparatus. The ESD protection structure includes: a driving chip configured to send a driving signal; a plurality of signal lines arranged in a display area, where the display area is equally divided into a first signal line area and a second signal line area, each of the plurality of signal lines located in the first signal line area is coupled with a positive polarity switch, each of the plurality of signal lines located in the second signal line area is coupled with a negative polarity switch, and the positive polarity switch and the negative polarity switch are electrically connected to the driving chip; and ESD protection circuits, each including a forward diode and a backward diode.

17 Claims, 3 Drawing Sheets

(51) Int. Cl.
*G02F 1/1362* (2006.01)
*H02H 9/04* (2006.01)

(52) U.S. Cl.
CPC ...... *H01L 27/0255* (2013.01); *H01L 27/0292* (2013.01); *H02H 9/045* (2013.01); *G09G 2310/08* (2013.01); *G09G 2320/103* (2013.01); *G09G 2330/021* (2013.01); *G09G 2330/04* (2013.01)

(56) References Cited

U.S. PATENT DOCUMENTS

2013/0113049 A1* 5/2013 Fang .................... G11C 29/785
257/E27.014
2019/0164464 A1* 5/2019 Zhang ................ H01L 27/0266

FOREIGN PATENT DOCUMENTS

| CN | 1908788 A | 2/2007 |
| CN | 101764397 A | 6/2010 |
| CN | 103295530 A | 9/2013 |
| CN | 106098684 A | 11/2016 |
| CN | 107357062 A | 11/2017 |

OTHER PUBLICATIONS

Jie Zhong, the International Searching Report dated Jul. 2019, CN.

* cited by examiner

ELECTROSTATIC DISCHARGE (ESD) PROTECTION STRUCTURE AND DISPLAY PANEL

CROSS REFERENCE OF RELATED APPLICATIONS

This application claims the priority to the Chinese Patent Application 2018113323235, filed with National Intellectual Property Administration, PRC on Nov. 9, 2018 and entitled "ELECTROSTATIC DISCHARGE (ESD) PROTECTION STRUCTURE AND DISPLAY APPARATUS", which is incorporated herein by reference in its entirety.

TECHNICAL FIELD

This application relates to the field of display, and in particular, to an electrostatic discharge (ESD) protection structure and a display apparatus.

BACKGROUND

Statements herein only provide background information related to this application, and do not necessarily constitute prior art.

A thin film transistor liquid crystal display (TFT-LCD) is currently one of main types of flat panel displays, and becomes an important display platform in modern IT and video products. In a main driving principle of the thin film transistor liquid crystal display (TFT-LCD), a system motherboard connects compressed red (R), green (G), and blue (B) signals, a control signal, and power to an electronic connector on a printed circuit board (PCB) through wires. Data is processed by a driving chip (timing controller IC, TCON IC) on the printed circuit board (PCB), and then connected to a display area by the printed circuit board (PCB) through source-chip on film (S-COF) and gate-chip on film (G-COF), so that the liquid crystal display (LCD) obtains required power supply and signals.

A refresh rate of a traditional panel is 60 Hz, which means that a screen is refreshed for 60 times per second. Each refresh is to charge and discharge each display pixel in the display area. When a picture is in a fast-moving state (such as playing a video, a game, scrolling, etc.), such refresh rate is still necessary. However, if the picture is a static picture, refreshing is still performed continuously; causing a lot of unnecessary loss of power consumption.

SUMMARY

In order to resolve defects in the foregoing, this application provides, based on traditional design that only a signal transmission wire is provided, an additional structure to achieve electrostatic discharge (ESD) protection, selective refreshing, and other effects.

An objective of this application is achieved by using the following technical solutions and an electrostatic discharge (ESD) protection structure of a display panel is provided according to this application. The ESD protection structure includes: a driving chip configured to send a driving signal; a plurality of signal lines arranged in a display area, where the display area is equally divided into a first signal line area and a second signal line area along a horizontal direction, each of the plurality of signal lines located in the first signal line area is coupled with a positive polarity switch, each of the plurality of signal lines located in the second signal line area is coupled with a negative polarity switch, and the positive polarity switch and the negative polarity switch are electrically connected to the driving chip; and ESD protection circuits, each including a forward diode and a backward diode. When the plurality of signal lines located in the first signal line area output low level signals and the plurality of signal lines located in the second signal line area output high level signals, the display area is not refreshed.

In one or more embodiments of this application, the forward diode has unilateral conductivity.

In one or more embodiment of this application, the backward diode has unilateral conductivity.

In one or more embodiments of this application, when the positive polarity switch and the negative polarity switch are turned on, an output end is electrically connected to an input end.

In one or more embodiments of this application, when the output end is electrically connected to the input end, an output value of the output end is equal to an input value of the corresponding input end.

In one or more embodiments of this application, when the positive polarity switch and the negative polarity switch are turned off, output of the output end is reversely cut off by the diode.

In one or more embodiments of this application, when the output of the output end is reversely cut off by the diode, the input end corresponding to the output end has no input value.

In one or more embodiments of this application, during displaying in the display area, a timing controller stores a previous picture and compares the previous picture to a current picture, and when the previous picture and the current picture are different, an output value of the driving signal in the first signal line area is high (H), and an output value of the driving signal in the second signal line area is low (L).

In one or more embodiments of this application, during displaying in the display area, a timing controller stores the previous picture and compares the previous picture to the current picture, and when the previous picture and the current picture are the same, the output value of the driving signal in the first signal line area is low (L), and the output value of the driving signal in the second signal line area is high (H), so that a gate output end is disconnected from a corresponding panel input end and the display area is not refreshed.

The objective and the solutions of this application may further be implemented in the following technical measures. For a display apparatus provided according to this application, the display apparatus includes a display panel. The display panel includes a plurality of pixels for displaying an image, and includes the foregoing ESD protection structure.

Through this application, design of the ESD protection structure is provided, and based on traditional design that only a signal transmission wire is provided, an additional structure is increased to achieve electrostatic discharge (ESD) protection, selective refreshing, and other effects.

DETAILED DESCRIPTION OF EMBODIMENTS

Figure 1:
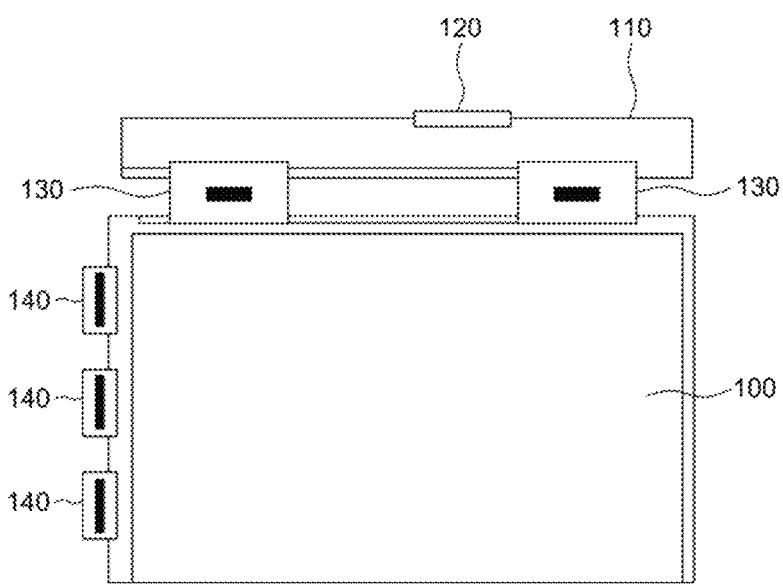
FIG. 1 is a schematic diagram of a driving architecture of a display panel.

The following embodiments are described with reference to the accompanying drawings, and are used to exemplify particular embodiments that this application can be used to implement. The directional terms mentioned in this application, for example, "upper", "lower", "before", "after", "left", "right", "inside", "outside", and "side", are only references to the directions in the drawings. Therefore, the used direction terms are intended to describe and understand this application, but are not intended to limit this application.

The drawings and description are considered to be illustrative in nature rather than restrictive. In the figures, structurally similar units are denoted by the same reference numerals. In addition, for understanding and ease of description, the size and thickness of each component in the drawings are arbitrarily shown, but this application is not limited to this.

In addition, in this specification, unless explicitly described to the contrary, the word "including" will be understood to mean including the component but not excluding any other component. Besides, in this specification, "on" means that it is above or below the target component and does not mean that it is necessary to be on top based on the direction of gravity.

In order to further explain technical means adopted by this application for achieving an intended application purpose and effects, in combination with the accompanying drawings and optional embodiments, specific implementation, structures, features, and effects of electrostatic discharge (ESD) protection and selective refreshing provided according to this application are described in detail below.

FIG. 1 is a schematic diagram of a driving architecture of a display panel. FIG. 1 illustrates a basic idea of this application. A display panel (thin film transistor liquid crystal display (TFT-LCD)) is currently one of main types of flat panel displays, and becomes an important display platform in modern IT and video products. In a main driving principle of the display panel (thin film transistor liquid crystal display (TFT-LCD)), a system motherboard connects compressed red (R), green (G), and blue (B) signals, a control signal, and power to an electronic connector on a printed circuit board (PCB) 110 through wires. Data is processed by a driving chip (timing controller IC, TCON IC) 120 on the printed circuit board (PCB) 110, and then connected to a display area 100 by the printed circuit hoard (PCB) 110 through source-chip on film (S-COF) 130 and gate-chip on film (G-COF) 140, so that the liquid crystal display (LCD) obtains required power supply and signals.

In the following embodiments, only a gate is taken as an example for illustration, but not limited thereto. Implementation of this application may be applied to both a source and the gate.

Figure 2:
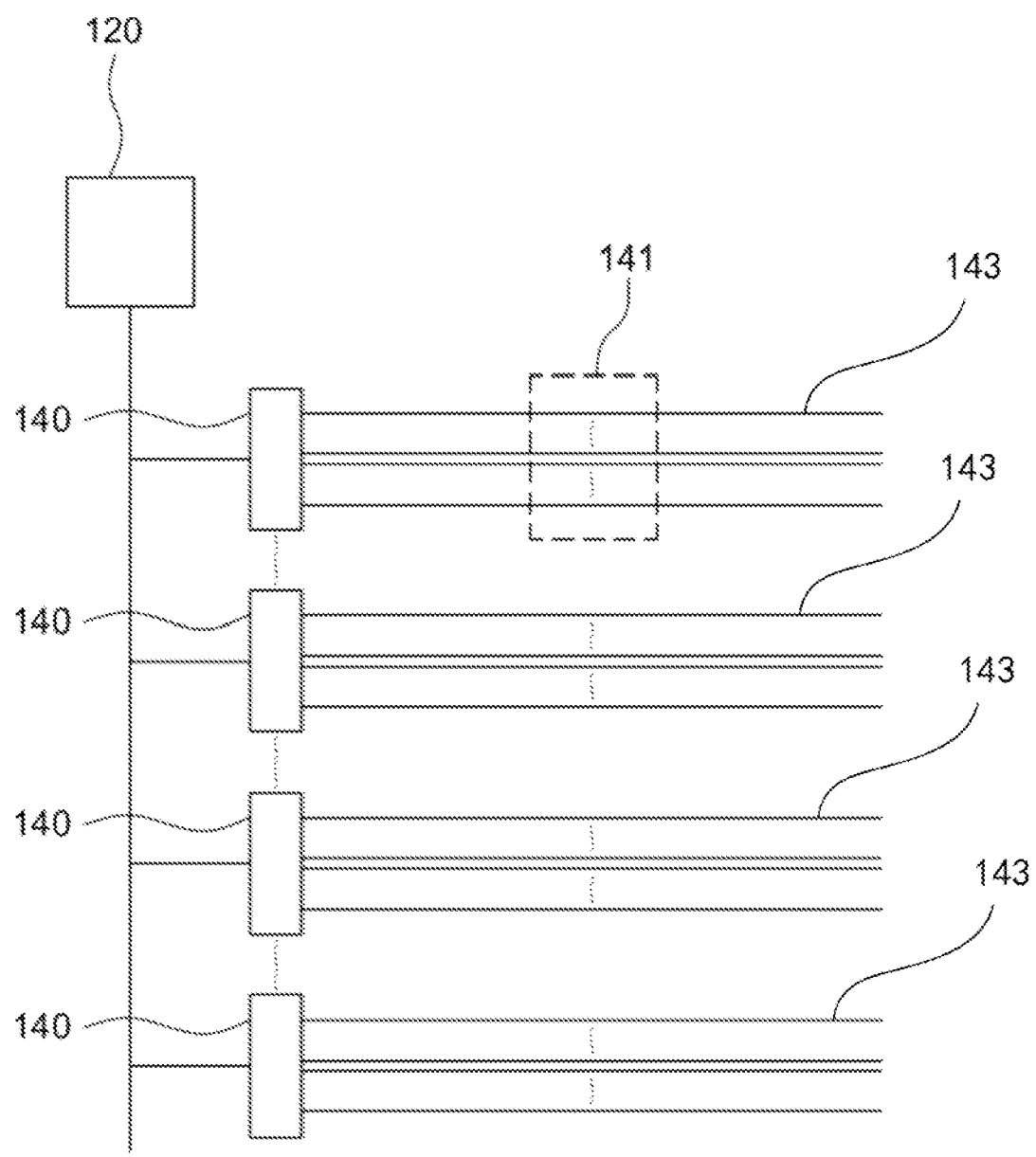
FIG. 2 is a schematic diagram of design of an electrostatic discharge (ESD) protection structure according to an embodiment of this application.
Figure 3:
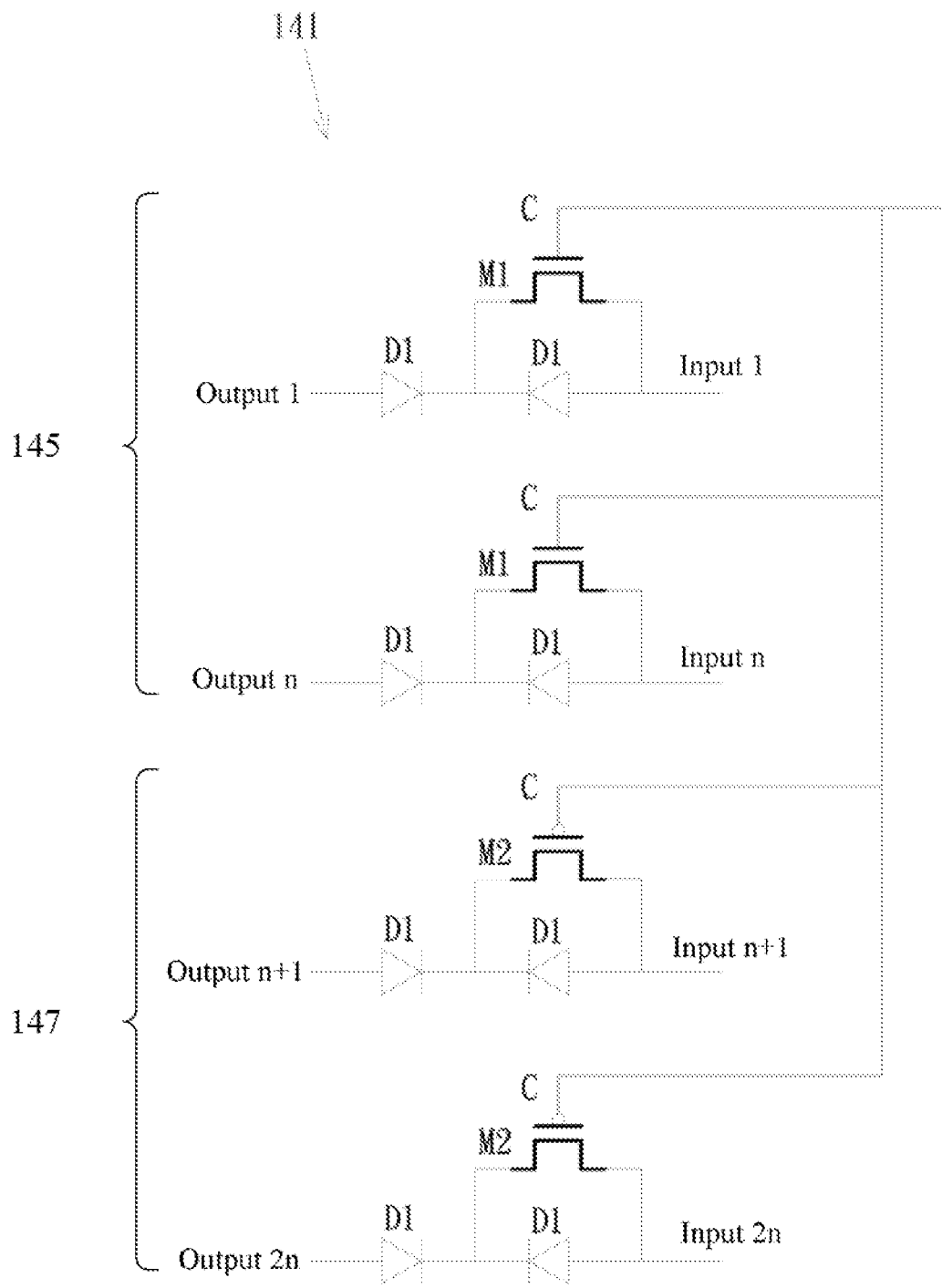
FIG. 3 is a schematic diagram of an ESD protection circuit of a single gate according to an embodiment of this application.

With reference to FIG. 1, FIG. 2, and FIG. 3, FIG. 2 is a schematic diagram of design of an electrostatic discharge (ESD) protection structure according to an embodiment of this application. FIG. 3 is a schematic diagram of an ESD protection circuit of a single gate according to an embodiment of this application. As shown in FIG. 2, the ESD protection structure includes a driving chip (timing controller IC, TCON IC) 120, a gate-chip on film (G-COF) 140, and a display area 100.

The display panel provided in this application includes the display area and a plurality of gates 140 arranged on a side of the display area. The ESD protection structure includes: a driving chip (timing controller IC, TCON IC) 120 configured to send a driving signal; a plurality of signal lines 143 (see FIG. 2) arranged on a side of the gate 140 of the display area (as shown in FIG. 1), where the display area is equally divided into a first signal line area 145 and a second signal line 145 area along a horizontal direction (see FIG. 3), each of the plurality of signal lines 143 located in the first signal line area 145 is coupled with a positive polarity switch (MOS, M1), each of the plurality of signal lines 143 located in the second signal line area 147 is coupled with a negative polarity switch (MOS, M2), and the positive polarity switch (MOS, M1) and the negative polarity switch (MOS, M2) are electrically connected to the driving chip (timing controller IC, ICON IC) 120; and an ESD protection circuit 141 correspondingly arranged on the gate in a one-to-one manner. Each of the ESD protection circuits includes a forward diode (D1) and a backward diode (D1). When the plurality of signal lines 143 located in the first signal line area 145 output low (L) level signals and the plurality of signal lines 143 located in the second signal line area 147 output high (H) level signals, the display area is not refreshed.

Further, in FIG. 3, D1 is a diode with unilateral conductivity. M1 is a positive polarity switch MOS and is called a positive polarity switch (MOS, M1) below. When a gate voltage thereof is high (H), the positive polarity switch (MOS, M1) is turned on. When the gate voltage thereof is low (L), the positive switch (MOS, M1) is turned off. M2 is a negative switch MOS and is called a negative polarity switch (MOS, M2) below. When the gate voltage thereof is low (L), the negative polarity switch (MOS, M2) is turned on, and when the gate voltage is high (H), the negative polarity switch (MOS, M2) is turned off A control signal C is output of the driving chip (timing controller IC, TCON IC) 120 and is connected to the gates of the positive polarity switch (MOS, M1) and the negative polarity switch (MOS, M2). The panel is divided into two parts along the horizontal direction. The first part has a positive polarity switch (MOS, M1), and the second part has a negative polarity switch (MOS, M2). Specifically, for a machine type with vertical HD resolution of 768, a gate output end n is a gate output end 384, a cell panel input end n is a panel input end 384; a gate output end n+1 is a gate output end 385, and a panel input end n+1 is a panel input end 385; and a gate output end 2n is a gate output end 768, and a panel input end 2n is a panel input end 768. When the positive polarity switch (MOS, M1) and the negative polarity switch (MOS, M2) are turned on, the gate output end may be connected to a corresponding panel input end, and at this time, and the gate output end=the panel Input end. When the positive polarity switch (MOS, M1) and the negative polarity switch (MOS, M2) are turned off, output of the gate output end is reversely cut off by a backward diode (D1), and the corresponding panel input end has no output.

When the panel performs display, the control signal C is controlled by the driving chip (timing controller IC, TCON IC) 120. When the system is running, normally, the driving chip (timing controller IC, TCON IC) 120 stores a previous picture and compares the previous picture to a current picture. In a case that the previous picture and the current picture are different, when a gate output end 1 to a gate output end n perform output, output of the control signal C is high (H), and when a gate output end n+1 to a gate output end 2n perform output, output of the control signal C is low (L). At this time, the gate output end=the panel input end.

The panel performs display normally. When the previous picture and the current picture are the same, when the gate output end 1 to the gate output end n perform output, the output of the control signal C is low (L), and when the gate output end n+1 to the gate output end 2*n* perform output, the output of the control signal C is high (H). At this time, the gate output end is disconnected from the panel input end, and the panel input end has no output. At this time, output of the source-chip on film (S-COF) is not input into the display area, and the display area is not refreshed, causing no loss of power consumption.

When a positive polarity switch (MOS, M1) of the first part of the panel in the vertical direction is turned on, a negative polarity switch (MOS, M2) of the second part is turned off, and the gate output end of the second part is disconnected from the panel input end. At this time, external electrostatic discharge is not conducted to the inside of a panel through the gate output end, so that a probability of being injured by the electrostatic discharge (ESD) in the panel is reduced. When the negative polarity switch (MOS, M2) is turned on, and the positive polarity switch (MOS, M1) is turned off, in the same principle, the probability of being injured by the electrostatic discharge (ESD) in the first part of the panel is reduced.

Based on the foregoing, ESD and selective refreshing can be achieved.

In the processing methods in FIG. 2 and FIG. 3, the following advantages are provided. In a case that the previous picture and the current picture are the same, when the gate output end 1 to the gate output end n perform output, the output of the control signal C is low (L), and when the gate output end n+1 to the gate output end 2*n* perform output, the output of the control signal C is high (H). At this time, the gate output end is disconnected from the panel input end, and the panel input end has no output. At this time, output of the source-chip on film (S-COF) is not input into the display area, and the display area is not refreshed, causing no loss of power consumption.

In some embodiments, when a positive polarity switch (MOS, M1) of the first part of the display panel in the vertical direction is turned on, and a negative polarity switch (MOS, M2) of the second part is turned off, and the gate output end of the second part is disconnected from the panel input end. At this time, external electrostatic discharge is not conducted to the inside of a panel through the gate output end, so that a probability of being injured by the electrostatic discharge (ESD) in the panel is reduced. When the negative polarity switch (MOS, M2) is turned on, and the positive polarity switch (MOS, M1) is turned off, in the same principle, the probability of being injured by the electrostatic discharge (ESD) in the first part of the panel is reduced.

Based on the foregoing methods, the following can be implemented: Based on traditional design that only a signal transmission wire is provided, an additional structure is increased to achieve electrostatic discharge (ESD) protection and selective refreshing.

The terms such as "in an embodiment of this application" and "in various embodiments" are repeatedly used. The terms used usually do not refer to the same embodiment, but the terms can also refer to the same embodiment. Words such as "comprise", "have" and "include" are synonyms, unless the context shows other meanings The above descriptions are merely optional embodiments of this application, and are not intended to restrict the application in any form. Although this application is described above with reference to the optional embodiments, the embodiments are not intended to limit this application. A person of skilled in the art may make some equivalent variations, alterations or modifications to the above-disclosed technical content without departing from the scope of the technical solutions of this application to obtain equivalent embodiments. However, any simple modification, equivalent change and modification made to the above embodiments according to the technical essence of the application without departing from the content of the technical solutions of this application shall fall within the scope of the technical solutions of this application.

What is claimed is:

1. An electrostatic discharge (ESD) protection structure of a display panel, the ESD protection structure comprising:
   a driving chip, configured to send a driving signal;
   a plurality of signal lines, arranged in a display area of the display panel, wherein the display area is equally divided into a first signal line area and a second signal line area along a horizontal direction, wherein each of the plurality of signal lines located in the first signal line area is coupled with a positive polarity switch, each of the plurality of signal lines located in the second signal line area is coupled with a negative polarity switch, and wherein the positive polarity switch and the negative polarity switch are each electrically connected to the driving chip; and
   a plurality of ESD protection circuits, each of the ESD protection circuits being connected to the respective signal line and comprising a forward diode and a backward diode, wherein
   wherein during a frame period, a low level control signal is output to the positive polarity switch connected to each of the plurality of signal lines located in the first signal line area and a high level control signal is output to the negative polarity switch connected to each of the plurality of signal lines located in the second signal line area, and so the display area is not refreshed.

2. The ESD protection structure of a display panel according to claim 1, wherein the forward diode has unilateral conductivity.

3. The ESD protection structure of a display panel according to claim 1, wherein the backward diode has unilateral conductivity.

4. The ESD protection structure of a display panel according to claim 1, wherein when the positive polarity switch and the negative polarity switch are turned on, an output end is electrically connected to an input end.

5. The ESD protection structure of a display panel according to claim 4, wherein when the output end is electrically connected to the input end, an output value of the output end is equal to an input value of the corresponding input end.

6. The ESD protection structure of a display panel according to claim 4, wherein when the positive polarity switch and the negative polarity switch are turned off, output of the output end is reversely cut off by the diode.

7. The ESD protection structure of a display panel according to claim 6, wherein when the output of the output end is reversely cut off by the diode, the input end corresponding to the output end has no input value.

8. The ESD protection structure of a display panel according to claim 1, wherein during displaying in the display area, a timing controller stores a previous picture and compares the previous picture to a current picture, and when the previous picture and the current picture are different, an output value of the driving signal in the first signal line area is high, and an output value of the driving signal in the second signal line area is low.

9. The ESD protection structure of a display panel according to claim 1, wherein during displaying in the display area, a timing controller stores a previous picture and compares the previous picture to a current picture, and when the previous picture and the current picture are the same, an output value of the driving signal in the first signal line area is low, and an output value of the driving signal in the second signal line area is high, so that a gate output end is disconnected from a corresponding panel input end and the display area is not refreshed.

10. A display panel, comprising a display area, a plurality of gates and a plurality of sources arranged on a side of the display area, and an electrostatic discharge (ESD) protection structure arranged in the display area, the ESD protection structure comprising:
a driving chip configured to send a driving signal;
a plurality of signal lines, wherein the display area is equally divided into a first signal line area and a second signal line area along a horizontal direction, wherein each of the plurality of signal lines located in the first signal line area is coupled with a positive polarity switch, each of the plurality of signal lines located in the second signal line area is coupled with a negative polarity switch, and wherein the positive polarity switch and the negative polarity switch are electrically connected to the driving chip; and
a plurality of ESD protection circuits, each being connected to the respective signal line and comprising a forward diode and a backward diode, wherein
during displaying in the display area, a timing controller stores a previous picture and compares the previous picture to a current picture, and when the previous picture and the current picture are different, then during a frame period of the current picture, high level control signal is output to the positive polarity switch connected to each of the plurality of signal lines located in the first signal line area, and a low level control signal is output to the negative polarity switch connected to each of the plurality of signal lines located in the second signal line area; and when the previous picture and the current picture are identical, then during a frame period of the current picture, a low level control signal is output to the positive polarity switch connected to each of the plurality of signal lines located in the first signal line area, and a high level control signal is output to the negative polarity switch connected to each of the plurality of signal lines located in the second signal line area, so that a gate output end is disconnected from a corresponding panel input end and so the display area is not refreshed.

11. The display panel according to claim 10, wherein the forward diode has unilateral conductivity.

12. The display panel according to claim 10, wherein the backward diode has unilateral conductivity.

13. The display panel according to claim 10, wherein when the positive polarity switch and the negative polarity switch are turned on, the output end is electrically connected to the input end.

14. The display panel according to claim 13, wherein when the output end is electrically connected to the input end, an output value of the output end is equal to an input value of the corresponding input end.

15. The display panel according to claim 13, wherein when the positive polarity switch and the negative polarity switch are turned off, output of the output end is reversely cut off by the diode.

16. The display panel according to claim 15, wherein when the output of the output end is reversely cut off by the diode, the input end co responding to the output end has no input value.

17. A display apparatus, comprising a display panel and a driving device, wherein
the display panel comprises a display area, a plurality of gates and a plurality of sources arranged on a side of the display area, and an electrostatic discharge (ESD) protection structure arranged in the display area, the ESD protection structure comprising:
a driving chip configured to send a driving signal;
a plurality of signal lines, wherein the display area is equally divided into a first signal line area and a second signal line area along a horizontal direction, wherein each of the plurality of signal lines located in the first signal line area is coupled with a positive polarity switch, each of the plurality of signal lines located in the second signal line area is coupled with a negative polarity switch, and wherein the positive polarity switch and the negative polarity switch are electrically connected to the driving chip; and
a plurality of ESD protection circuits, each being connected to the respective signal line and comprising a forward diode and a backward diode, wherein
during displaying in the display area, a timing controller stores a previous picture and compares the previous picture to a current picture, and when the previous picture and the current picture are different, then during a frame period of the current picture, a high level control signal is output to the positive polarity switch connected to each of the plurality of signal lines located in the first signal line area, and a low level control signal is output to the negative polarity switch connected to each of the plurality of signal lines located in the second signal line; and when the previous picture and the current picture are identical, then during a frame period of the current picture, a low level control signal is output to the positive polarity switch connected to each of the plurality of signal lines located in the first signal line area, and a high level control signal is output to the negative polarity switch connected to each of the plurality of signal lines located in the second signal line area, so that a gate output end is disconnected from a corresponding panel input end and the display area is not refreshed, wherein
when the positive polarity switch and the negative polarity switch are turned on, the output end is electrically connected to the input end, and when the output end is electrically connected to the input end, an output value of the output end is equal to an input value of the corresponding input end; and
when the positive polarity switch and the negative polarity switch are turned off, output of the output end is reversely cut off by the diode, and when the output of the output end is reversely cut off by the diode, the input end corresponding to the output end has no input value.

* * * * *